(12) United States Patent
Bodenweber et al.

(10) Patent No.: US 9,401,315 B1
(45) Date of Patent: Jul. 26, 2016

(54) THERMAL HOT SPOT COOLING FOR SEMICONDUCTOR DEVICES

(71) Applicant: GLOBALFOUNDRIES Inc., Grand Cayman (KY)

(72) Inventors: Paul F. Bodenweber, Kingston, NY (US); Taryn J. Davis, Beacon, NY (US); Marcus E. Interrante, New Paltz, NY (US); Chenzhou Lian, Poughquag, NY (US); Kenneth C. Marston, Poughquag, NY (US); Kathryn C. Rivera, Hopewell Junction, NY (US); Kamal K. Sikka, Poughkeepsie, NY (US); Hilton T. Toy, Hopewell Junction, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/669,775

(22) Filed: Mar. 26, 2015

(51) Int. Cl.
*H01L 23/367* (2006.01)
*H01L 23/373* (2006.01)
*H01L 23/492* (2006.01)
*H01L 23/00* (2006.01)

(52) U.S. Cl.
CPC ........ *H01L 23/3675* (2013.01); *H01L 23/3732* (2013.01); *H01L 23/3736* (2013.01); *H01L 23/492* (2013.01); *H01L 24/83* (2013.01); H01L 2224/29139 (2013.01); H01L 2224/32225 (2013.01); H01L 2224/32245 (2013.01); H01L 2224/83201 (2013.01); H01L 2224/83801 (2013.01); H01L 2924/16747 (2013.01); H01L 2924/16793 (2013.01)

(58) Field of Classification Search
CPC .................................................. H01L 23/3675
See application file for complete search history.

(56) References Cited

U.S. PATENT DOCUMENTS 5,247,426 A 9/1993 Hamburgen et al.
6,396,700 B1 5/2002 Chu et al.
(Continued)

OTHER PUBLICATIONS

S. M. Sri-Jayantha et al., "Thermomechanical modeling of 3D electronic packages," IBM Journal of Research and Development, vol. 52, No. 6, Nov. 2008, pp. 623-634.
(Continued)

*Primary Examiner* — Lex Malsawma
(74) *Attorney, Agent, or Firm* — Heslin Rothenberg Farley & Mesiti P.C.

(57) ABSTRACT

A semiconductor device package which includes a semiconductor package, a semiconductor device joined to the semiconductor package; and a lid to be placed over the semiconductor device and joined to the semiconductor package. The lid includes: a block of a first material having a first surface and a second surface, the second surface facing the semiconductor device, the block having perforations extending between the first surface and the second surface; inserts for filling the perforations, each of the inserts being made of a second material, at least one of the inserts protrudes beyond the second surface towards the semiconductor device; and a bonding material to bond the inserts to the block so that the at least one of the inserts protrudes beyond the second surface towards the semiconductor device. Also included is a method of assembling a semiconductor device package.

20 Claims, 4 Drawing Sheets

(56) References Cited

U.S. PATENT DOCUMENTS

| | | |
|---|---|---|
| 7,286,359 B2 | 10/2007 | Khbeis et al. |
| 7,464,462 B2 | 12/2008 | Edwards et al. |
| 8,063,483 B2 | 11/2011 | Dimitrakopoulos et al. |
| 8,115,303 B2 * | 2/2012 | Bezama .............. H01L 23/3675 257/707 |
| 8,787,013 B1 | 7/2014 | Czamara et al. |
| 2004/0118501 A1 | 6/2004 | Chiu et al. |
| 2007/0290322 A1 | 12/2007 | Zhao et al. |
| 2014/0061894 A1 * | 3/2014 | Chopin ................... H01L 21/56 257/712 |

OTHER PUBLICATIONS

J. Wei, "Challenges in cooling design of CPU packages for high-performance servers," Heat Transfer Engineering, vol. 29, No. 2, 2008, pp. 178-187.

M. Smalc et al., "Thermal performance of natural graphite heat spreaders," Proceedings of IPACK2005, ASME InterPACK '05, Jul. 17-22, 2005, pp. 79-89.

* cited by examiner

THERMAL HOT SPOT COOLING FOR SEMICONDUCTOR DEVICES

BACKGROUND

The present invention relates generally to integrated circuit heat dissipation devices, and, more particularly, to a semiconductor package lid that has high thermal conductivity inserts for alleviating thermal hot spots from semiconductor devices.

The semiconductor industry has seen tremendous technological advances in recent years that have permitted dramatic increases in circuit density and complexity, as well as equally dramatic increases in power consumption and package sizes.

Present semiconductor technology now permits single-chip and multi-chip microprocessors with many millions of transistors, operating at speeds of tens (or even hundreds) of MIPS (millions of instructions per second), to be packaged in relatively small, air-cooled semiconductor device packages. Because semiconductor devices (also referred to as microprocessors) and other related components are designed with increased capabilities and increased speed, additional heat is generated from these components.

As packaged units and semiconductor device sizes shrink, the amount of heat energy given off by a component for a given unit of surface area is also on the rise. The majority of the heat generated by a component, such as a semiconductor device for example, must be removed from the component in order to keep the component at an acceptable or target operating temperature. If the heat generated is not removed from the component, the heat produced can drive the temperature of the component to levels that may result in early failure of the component.

High end server products continue to improve system performance by using multi-core semiconductor devices. The high power densities in the core areas may generate local hot spots across the semiconductor device. Elevated temperatures impact the reliability and performance of the semiconductor device. The temperature in the semiconductor device including local hot spots in the semiconductor device cores must be managed to attain the desired reliability and performance.

BRIEF SUMMARY

The various advantages and purposes of the exemplary embodiments as described above and hereafter are achieved by providing, according to a first aspect of the exemplary embodiments, a semiconductor device package comprising: a semiconductor package; a semiconductor device joined to the semiconductor package; and a lid to be placed over the semiconductor device and joined to the semiconductor package, the lid comprising: a block of a first material having a first surface and a second surface, the second surface facing the semiconductor device, the block having a plurality of perforations extending between the first surface and the second surface; a plurality of inserts for filling the perforations, each of the inserts being made of a second material, at least one of the plurality of inserts protrudes beyond the second surface towards the semiconductor device; and a bonding material to bond the plurality of inserts to the block so that the at least one of the plurality of inserts protrudes beyond the second surface towards the semiconductor device.

According to a second aspect of the exemplary embodiments, there is provided a lid for a semiconductor device package comprising: a block of a first material having a first surface and a second surface, the second surface facing a semiconductor device, the block having a plurality of perforations extending between the first surface and the second surface; a plurality of inserts for filling the perforations, each of the inserts being made of a second material, at least one of the plurality of inserts protruding beyond the second surface; and a bonding material to bond the plurality of inserts to the block so that the at least one of the plurality of inserts protrudes beyond the second surface towards the semiconductor device.

According to a third aspect of the exemplary embodiments, there is provided a method of assembling a semiconductor device package comprising: obtaining a semiconductor package having a semiconductor device joined to the semiconductor package; obtaining a lid for the semiconductor device package comprising a block of a first material having a first surface and a second surface, the second surface facing the semiconductor device, the block having a plurality of perforations extending between the first surface and the second surface; positioning the lid on the semiconductor device and the semiconductor package; inserting a plurality of inserts into the perforations, each of the inserts being made of a second material, at least one of the plurality of inserts protrudes beyond the second surface so as to contact the semiconductor device; applying a bonding material to bond the plurality of inserts to the lid; applying a force to the lid and the at least one of the plurality of inserts so that the at least one insert maintains contact with the semiconductor device while the bonding material hardens; removing the force and separating the lid from the semiconductor device; applying a thermal interface material to the lid or the semiconductor device; positioning the lid on the semiconductor device and the semiconductor package; applying an adhesive material between the lid and the semiconductor package; applying a force to the lid to force the at least one of the plurality of inserts into the thermal interface material; and curing the adhesive material between the lid and the semiconductor package.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION

The exemplary embodiments integrate highly conductive insert material into an existing heat spreading lid (hereafter just lid). The insert may be made from a highly conductive material such as but not limited to graphite, copper or chemically vapor deposited (CVD) diamond. The insert position in the lid may be tailored so as to be positioned directly over hot spot locations. The thermal Interface material (TIM) bondline thickness (BLT) (i.e., the thickness of the thermal interface material between the insert and the semiconductor device) may also be minimized at the hot spot locations so as to conform to the semiconductor device surface to provide better thermal performance. There may be a thermal improvement of about 2° C. in the semiconductor device hot spot area as compared to assemblies without the inserts in the lid.

The exemplary embodiments may also be ideal for semiconductor devices on organic packaging because the inserts may also compensate for the warpage induced interface variation in TIM BLT.

Figure 1:
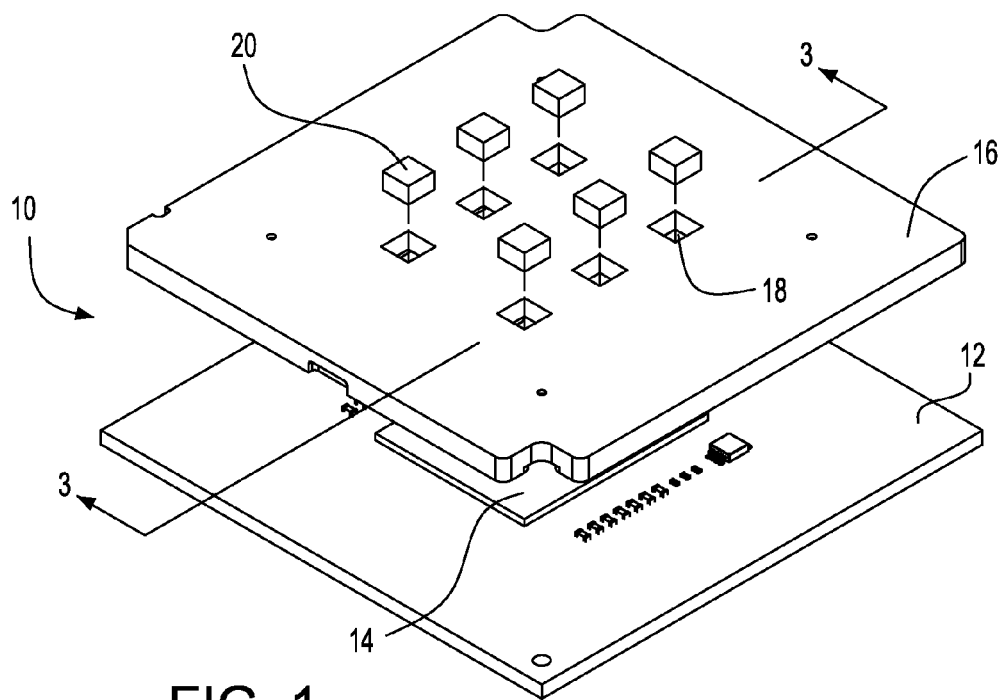
FIG. 1 is an isometric view showing a top view of a lid having inserts and a semiconductor package.

Referring to the Figures in more detail, and particularly referring to FIG. 1, there is shown an exploded view of a semiconductor module 10 according to the exemplary embodiments. The semiconductor module 10 may include a semiconductor package 12 which may be a ceramic or non-ceramic material such as an organic package. The exemplary embodiments may be applicable to any type of packaging suitable for supporting and electrically connecting to a semiconductor device.

On semiconductor package 12 may be one or more semiconductor devices 14, electrically and physically connected to the semiconductor package 12. In FIG. 1, for purposes of illustration and not limitation, there is shown one semiconductor device 14.

Assembled above semiconductor device 14 may be a lid 16. The lid 16 may typically be made from a thermally conductive material such as copper or a copper alloy. Pure copper (99.9% copper) is most preferred for its high thermal conductivity. The lid 16 may have at least one perforation 18 extending entirely through the lid 16. For purposes of illustration and not limitation, lid 16 shown in FIG. 1 may have six perforations 18. Within each perforation 18 may be situated an insert 20.

Inserts 20 may be made from a high thermally conductive material such as but not limited to graphite, copper or CVD diamond. The graphite may be, for example, orthotropic pyrolytic graphite. Even though the lid 16 and insert 20 may both be made from copper, the improved design of the lid 16 may lead to improved removal of heat from the semiconductor device 14 due to the reduced bondline thickness of the thermal interface material.

The semiconductor device 14 may be a multi-core semiconductor device. Each of the cores may lead to hot spots which may require an insert 20. For example, the semiconductor device 14 illustrated in FIG. 1 may be a six core semiconductor device having six hot spots requiring six inserts 20. The number of inserts 20 need not exactly correspond with the number of cores since one or more of the cores may be disabled for one reason or another. Moreover, in semiconductor devices 14 having cores close to each other, a single insert may be used to cover one or more of the cores. While one semiconductor device 14 is shown in FIG. 1, there may be more than one semiconductor device 14 and each one of the semiconductor devices 14 may require one or more inserts 20.

The inserts 20 may be sized to fit the core area or core areas of the semiconductor device 14. For example, for a semiconductor device having a size of 29.8 mm by 25.6 mm, the inserts 20 may have a size of 4 mm by 4 mm with a thickness of 2.6 mm.

Figure 2:
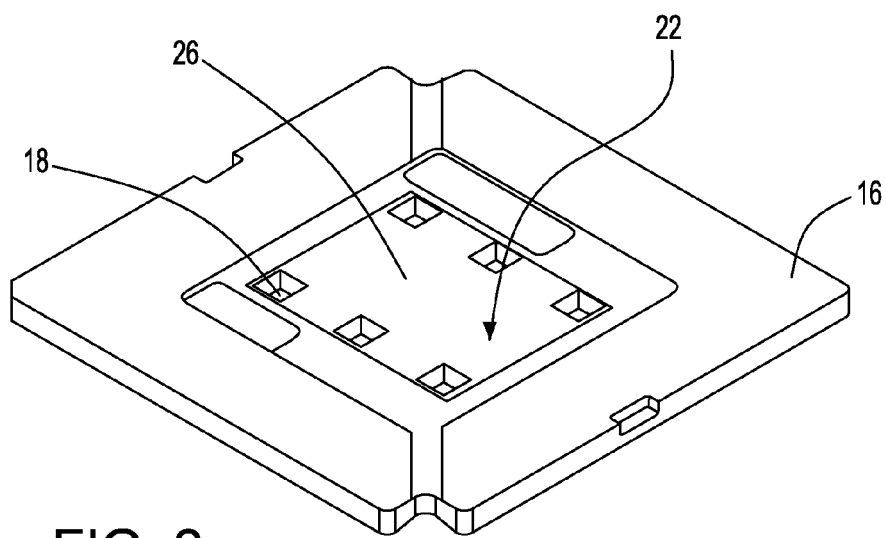
FIG. 2 is an isometric view showing a bottom view of the lid in FIG. 1.

FIG. 1 shows the lid 16 from the top. The bottom of the lid 16 is shown in FIG. 2. The lid 16 may have a recess 22 that is sized to fit over the one or more semiconductor devices that may be joined to the semiconductor package 12. As can also be seen in FIG. 2, the perforations 18 for receiving the inserts 20 extend entirely through the lid 16 and most preferably, the inserts 20 protrude passed the bottom surface 26 of the lid.

Figure 3A:
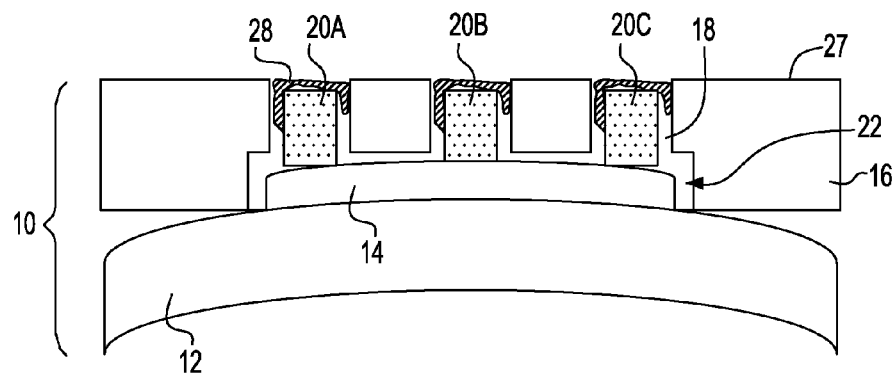
FIG. 3A is a cross sectional view of an assembled semiconductor module having a lid with thermally conductive inserts.
Figure 3B:
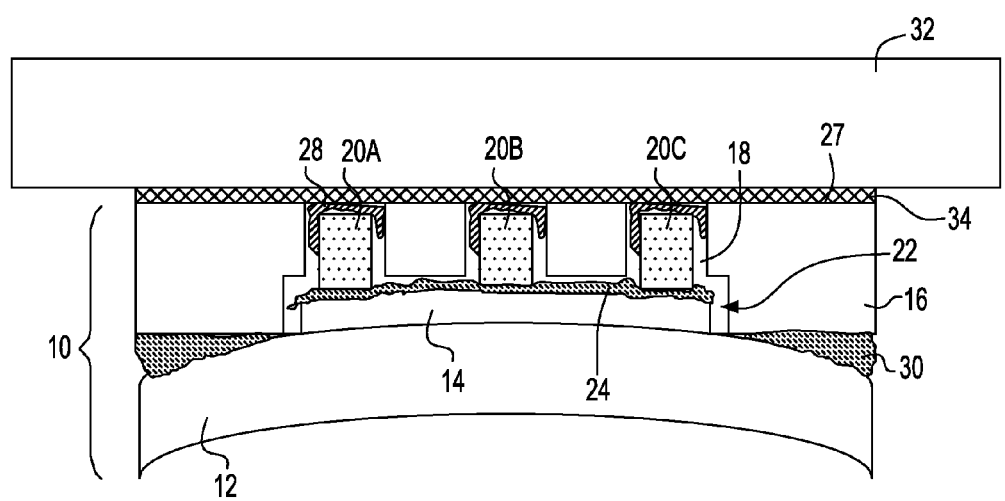
FIG. 3B is a cross sectional view of an assembled semiconductor module having a lid with thermally conductive inserts similar to FIG. 3A but also including a lid adhesive, thermal interface materials and a cold plate.

FIG. 3A is a cross-section of FIG. 1 in the direction of arrows 3-3 in FIG. 1. FIG. 3B shows the module 10 fully assembled. A problem with organic semiconductor packages is that the semiconductor package 12 may be cambered (i.e., not flat) which causes semiconductor device 14 to also be cambered so that good thermal contact and a uniform gap between the lid 16 and semiconductor device 14 may not be possible. The camber shown in FIG. 3A is somewhat exaggerated for the purpose of illustration but it can be seen that the lid 16 without the inserts 20 would only make good thermal contact with the semiconductor device 14 with a thin gap in the center of the semiconductor device 14 and not at the corners of the semiconductor device 14 due to a larger gap. The gap between the lid 16 and semiconductor device 14 at the corners of the semiconductor device 14 is larger than at the center of the semiconductor device 14 which causes poor thermal performance. Even with the presence of a thermal interface material, the lid 16 without the inserts 20 may not have a uniform thin gap and therefore not make good thermal contact with the semiconductor device 14.

Lid 16 contains the six inserts 20, three of which are shown as inserts 20A, 20B, 20C. Again, six inserts in lid 16 is just for the purpose of illustration and not limitation and in practice, there may be more or less than six inserts. At least one of the inserts 20A, 20B, 20C may protrude from the bottom surface 26 of the lid 16 to compensate for the camber of semiconductor package 12. For purposes of illustration and not limitation, each of the inserts 20A, 20B, 20C may protrude beyond the surface 26 of the lid 16 by a different amount. There will usually be at least one insert 20 that protrudes beyond the surface 26 of the lid 16. Moreover, the inserts 20 may not extend beyond the upper surface 27 of the lid 16. Typically, camber may result in a distortion of about 100 μm so that at least one of the inserts 20 in general may need to extend from the bottom surface 26 about the same amount to compensate for the camber. Because the inserts 20A, 20B, 20C compensate for the different height of the semiconductor device 14 due to the camber of the semiconductor package 12, there will be a uniform bondline thickness of the thermal interface material 24 (shown in FIG. 3B) at each insert 20A, 20B, 20C at each hot spot.

Once the inserts 20 have been assembled in lid 16 by a process to be described hereafter, the inserts 20 may be bonded to the lid 16 by a bonding material 28 to hold the inserts 20 rigidly in place. The bonding material 28 may be, for example, an adhesive or more preferably a solder. The adhesive may be a silver-filled adhesive or silver-filled epoxy so that it has good thermal conductivity. Most preferred is to use a solder because of better thermal conductivity which is desirable to conduct heat between the inserts 20 and the lid 16. Lead-free solders are preferred such as SAC 305 comprising tin (Sn), silver (Ag) and copper (Cu). If the inserts 20 are made from one of the nonmetallic materials mentioned above, it may be desirable to coat the inserts 20 with a material such as nickel, chrome or gold so that the solder may adhere better to the insert 20.

In another assembly process, shown completed in FIG. 3B, thermal interface material 24 may be applied to the semiconductor device 14 and the lid 16 may be bonded to the semiconductor package 12 by an adhesive 30.

In various exemplary embodiments, there may be a heat spreader 32 in addition to the lid 16. To maintain good thermal contact between the heat spreader 32 and the lid 16, there may be a second thermal interface material 34.

The fully assembled module with thermal interface material 24, lid adhesive 30, heat spreader 32 and thermal interface material 34 is shown in FIG. 3B.

Figure 4:
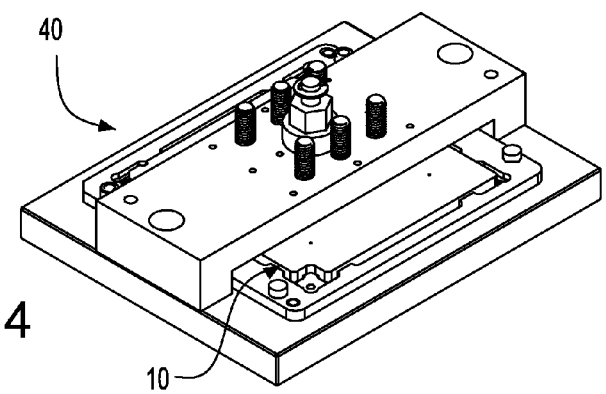
FIG. 4 is an isometric view of the lid and semiconductor package in a fixture in preparation for setting the height of the inserts with respect to the chip surface on the semiconductor package.

Referring now to FIG. 4, there is shown the module 10 in a fixture 40 by which the inserts 20 may be adjusted in the lid 16 and then bonded to the lid 16.

Figure 5:
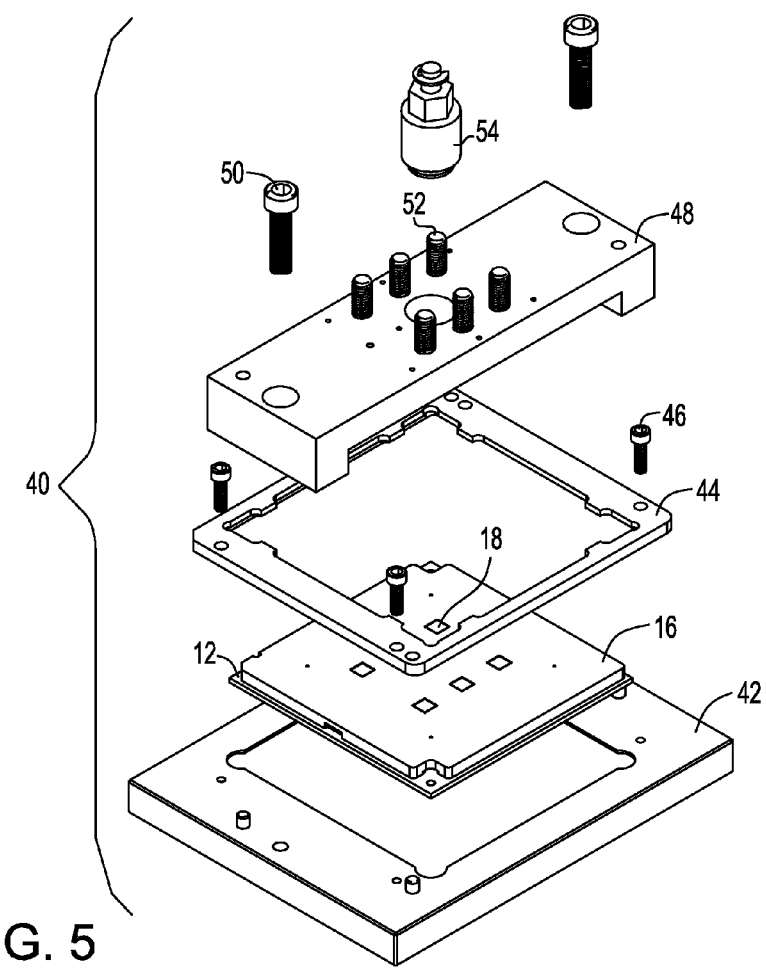
FIG. 5 is an exploded view of the lid, semiconductor package and fixture of FIG. 4.

FIG. 5 is an exploded isometric view of the fixture 40 shown in FIG. 4.

Fixture 40 includes a base plate 42 upon which module 10 and lid 16 may be positioned. The module 10 and lid 16 are properly aligned to the base plate 42 by locator frame 44. Locator frame 44 may be secured to the base plate 42 by threaded fasteners 46. Inserts 20 (not shown in FIGS. 4 and 5) may be placed in perforations 18 of lid 16. Bonding material 28 (not shown in FIGS. 4 and 5) may also be applied at this time. Thereafter, load housing 48 may be affixed to the base plate 42 by threaded fasteners 50. Within load housing 48 are threaded ball-nose spring plungers 52 which are threaded into the load housing 48. These threaded ball-nose spring plungers 52 contact inserts 20. A load spring 54 may apply a force to at least partially flatten out the camber from module 10. For example, application of the load spring 54 may reduce the camber of the module 10 from about 250 µm to 100 µm but does not entirely eliminate the camber. Threaded ball-nose spring plungers 52 are threaded against the inserts 20 until the inserts 20 make contact with the semiconductor device 14. A force of approximately 2 to 3 pounds is applied by each of the plungers 52 to the semiconductor device 14. At this juncture, the fixture 40, module 10 and lid 16 with inserts 20 are heated to a sufficient temperature so that the bonding material 28 is either reflowed if the bonding material is solder or cured if the bonding material is an adhesive. After cooling down, the module 10 and lid 16 with inserts 20 may be removed from the fixture 40. The inserts 20 are now set in lid 16.

The lid 16 may now be assembled to semiconductor package 12 with thermal interface material 24 and lid adhesive 30. Fixture 40 may be used to assemble the lid 16 with inserts 20 to the semiconductor package 12 but without application of the load by plungers 52. Either the plungers 52 may be backed out of the load housing 48 or a load housing 48 may be substituted that does not have the plungers 52. The fixture 40 with the assembled module 10 may be heated to a predetermined temperature to cure the lid adhesive 30. The predetermined temperature for the lid adhesive cure process is less than the melting point of the solder bonding material 28.

Figure 6:
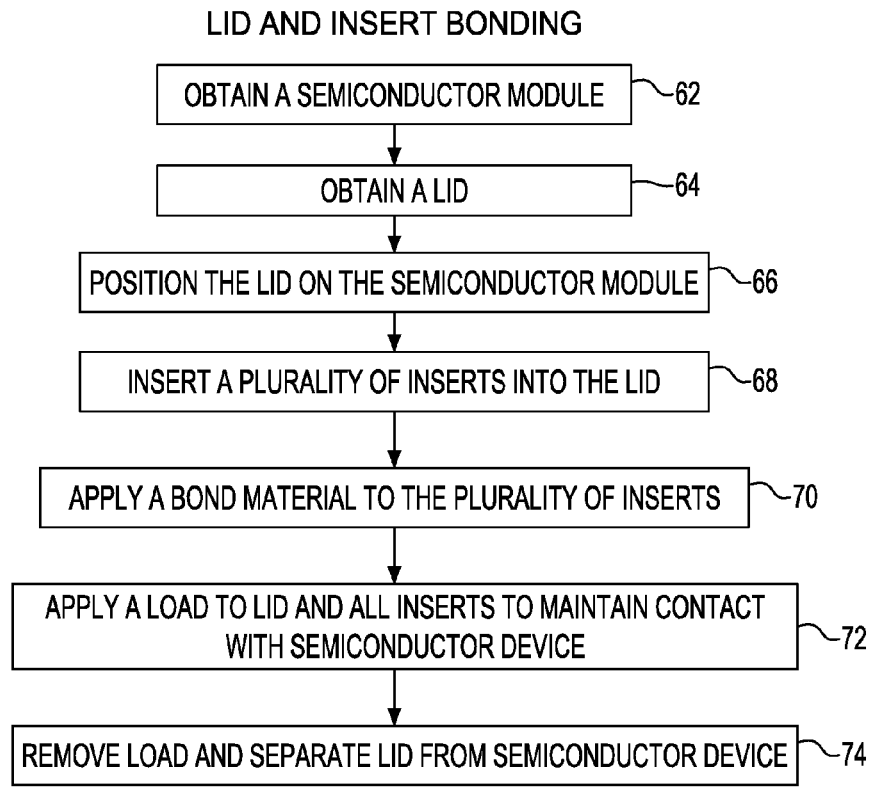
FIG. 6 is a process flow for lid and insert bonding of the semiconductor module of FIG. 3A.
Figure 7:
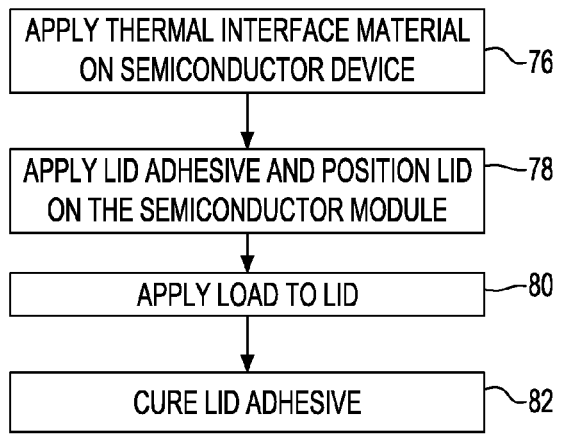
FIG. 7 is a process flow for module capping assembly of the semiconductor module of FIG. 3B.

The exemplary embodiments may be practiced with a process as described with respect to FIGS. 6 and 7. The reference numbers that follow refer back to the corresponding elements in FIGS. 1 to 5. FIG. 6 describes the lid and insert bonding process while FIG. 7 describes the module capping assembly process.

The lid and insert bonding process begins by obtaining a module 10 of a semiconductor package 12 and a semiconductor device 14 conventionally joined to the semiconductor package 12, box 62. The semiconductor device 14 may be conventionally underfilled with an underfill material if required.

A lid is obtained, box 64, such as lid 16 described previously and shown in detail in FIGS. 1 and 2. The lid 16 should have the perforations 18 suitable for receiving the inserts 20.

The lid 16 is positioned on the module 10, box 66, inserts are placed in the perforations of the lid, box 68, and then a bonding material may be dispensed to the inserts, box 70.

The assembly of module 10, lid 16, inserts 20 and bonding material 28 may be placed on the base plate 42 of fixture 40 followed by the locator frame 44 secured by fasteners 46, load housing 48 secured by fasteners 50, and plungers 52. A suitable load may be applied by load spring 54, box 72, to hold the lid 16 firmly against the semiconductor package 12 which may also partly remove the camber of the module 10. Inserts 20 may then be pushed until contact is made with the semiconductor device 14. Approximately 2 to 3 pounds of force may be applied by the plungers 52 to the semiconductor device 14 through application of the load spring 54. The fixture 40, module 10 and lid 16 with inserts 20 are heated to a suitable temperature to cure the adhesive or reflow the solder, whichever is used as the bonding material for the inserts 20.

The load applied by the lid load spring 54 is removed and the lid 16 with bonded inserts 20 is removed from the fixture 40 along with the module 10, box 74.

Referring now to FIG. 7, for module capping assembly, the lid 16 with bonded inserts 20 is assembled to semiconductor package 12. Conventional thermal interface material 24 may be applied to the semiconductor device 14, box 76.

An adhesive 30 may be dispensed between the lid 16 and semiconductor package 12 and then the lid 16 with bonded inserts 20 may be placed on the semiconductor package 12 and semiconductor chip 14, box 78. A load of about 40 to 50 pounds (depending on the size of the semiconductor device) may be applied to the lid 16 so that the inserts 20 are pressed into the thermal interface material 24 and a uniform bondline thickness of the thermal interface material is obtained, box 80. The adhesive 30 may be conventionally cured, box 82.

The module capping assembly described in FIG. 7 may use the fixture 40 described in FIGS. 4 and 5 but without the load applied by the plungers 52 as described earlier.

It is noted that with the present exemplary embodiments, a bondline thickness at the center of the semiconductor device and at the corner of the semiconductor device may each be about 15 µm. Previously, the best bondline thickness of the thermal interface material that could be obtained was about 15 µm at the center of the semiconductor device and about 35-40 µm at the corner of the semiconductor device.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:
1. A semiconductor device package comprising:
a semiconductor package;
a semiconductor device joined to the semiconductor package; and
a lid to be placed over the semiconductor device and joined to the semiconductor package, the lid comprising:
a block of a first material having a first surface and a second surface, the second surface facing the semi- conductor device, the block having a plurality of perforations extending between the first surface and the second surface;

a plurality of inserts for filling the perforations, each of the inserts being made of a second material, at least one of the plurality of inserts protrudes beyond the second surface towards the semiconductor device; and a bonding material to bond the plurality of inserts to the block so that the at least one of the plurality of inserts protrudes beyond the second surface towards the semiconductor device.

2. The semiconductor device package of claim 1 wherein the bonding material is a solder.

3. The semiconductor device package of claim 1 wherein the bonding material is an adhesive.

4. The semiconductor device package of claim 1 wherein the second material being different than the first material and the second material having a higher thermal conductivity than the first material.

5. The semiconductor device package of claim 1 wherein the second material is the same as the first material.

6. The semiconductor device package of claim 1 wherein the plurality of inserts are made of a material selected from the group consisting of graphite, copper and CVD diamond.

7. The semiconductor device package of claim 6 wherein the plurality of inserts are either graphite or CVD diamond and are coated with a material selected from the group consisting of nickel, chrome and gold.

8. The semiconductor device package of claim 1 further comprising a thermal interface material between the lid and the semiconductor device wherein the at least one of the plurality of inserts that protrudes beyond the second surface reduces a bondline thickness of the thermal interface material between the at least one of the plurality of inserts and the semiconductor device as compared to a bondline thickness of the thermal interface material away from the at least one of the plurality of inserts.

9. The semiconductor device package of claim 8 wherein there is a second insert of the plurality of inserts that protrudes beyond the second surface so as to reduce a bondline thickness of the thermal interface material between the second insert of the plurality of inserts and the semiconductor device as compared to a bondline thickness of the thermal interface material away from the second insert of the plurality of inserts such that the one insert and the second insert protrude by different amounts beyond the second surface but reduce the bondline thickness of the thermal interface material between the one insert and the semiconductor device and the bondline thickness of the thermal interface material between the second insert and the semiconductor device by the same amount.

10. A lid for a semiconductor device package comprising:

a block of a first material having a first surface and a second surface, the second surface facing a semiconductor device, the block having a plurality of perforations extending between the first surface and the second surface;

a plurality of inserts for filling the perforations, each of the inserts being made of a second material, at least one of the plurality of inserts protruding beyond the second surface; and a bonding material to bond the plurality of inserts to the block so that the at least one of the plurality of inserts protrudes beyond the second surface towards the semiconductor device.

11. The lid of claim 10 wherein the bonding material is a solder.

12. The lid of claim 10 wherein the bonding material is an adhesive.

13. The lid of claim 10 wherein the second material being different than the first material and the second material having a higher thermal conductivity than the first material.

14. The lid of claim 10 wherein the second material is the same as the first material.

15. The lid of claim 10 wherein the plurality of inserts are made of a material selected from the group consisting of graphite, copper and CVD diamond.

16. The lid of claim 15 wherein the plurality of inserts are graphite or CVD diamond and are coated with a material selected from the group consisting of nickel, chrome and gold.

17. A method of assembling a semiconductor device package comprising:

obtaining a semiconductor package having a semiconductor device joined to the semiconductor package;

obtaining a lid for the semiconductor device package comprising a block of a first material having a first surface and a second surface, the second surface facing the semiconductor device, the block having a plurality of perforations extending between the first surface and the second surface;

positioning the lid on the semiconductor device and the semiconductor package;

inserting a plurality of inserts into the perforations, each of the inserts being made of a second material, at least one of the plurality of inserts protrudes beyond the second surface so as to contact the semiconductor device;

applying a bonding material to bond the plurality of inserts to the lid;

applying a force to the lid and the at least one of the plurality of inserts so that the at least one insert maintains contact with the semiconductor device while the bonding material hardens;

removing the force and separating the lid from the semiconductor device;

applying a thermal interface material to the lid or the semiconductor device;

positioning the lid on the semiconductor device and the semiconductor package;

applying an adhesive material between the lid and the semiconductor package;

applying a force to the lid to force the at least one of the plurality of inserts into the thermal interface material; and curing the adhesive material between the lid and the semiconductor package.

18. The method of claim 17 wherein the at least one of the plurality of inserts that protrudes beyond the second surface reduces a bondline thickness of the thermal interface material between the at least one of the plurality of inserts and the semiconductor device as compared to a bondline thickness of the thermal interface material away from the at least one of the plurality of inserts.

19. The method of claim 18 wherein there is a second insert of the plurality of inserts that protrudes beyond the second surface so as to reduce a bondline thickness of the thermal interface material between the second insert of the plurality of inserts and the semiconductor device as compared to a bondline thickness of the thermal interface material away from the second insert of the plurality of inserts such that the one insert and the second insert protrude by different amounts beyond the second surface but reduce the bondline thickness between the one insert and the semiconductor device and the bondline thickness of the thermal interface material between the second insert and the semiconductor device by the same amount.

20. The method of claim 17 wherein the plurality of inserts are made of a material selected from the group consisting of graphite, copper and CVD diamond.

* * * * *